United States Patent
Tanaya

(10) Patent No.: US 8,847,694 B2
(45) Date of Patent: *Sep. 30, 2014

(54) VIBRATOR ELEMENT, VIBRATOR, OSCILLATOR, AND ELECTRONIC APPARATUS

(75) Inventor: Hideo Tanaya, Suwa (JP)

(73) Assignee: Seiko Epson Corporation (JP)

( * ) Notice: Subject to any disclaimer, the term of this patent is extended or adjusted under 35 U.S.C. 154(b) by 53 days.

This patent is subject to a terminal disclaimer.

(21) Appl. No.: 13/474,201

(22) Filed: May 17, 2012

(65) Prior Publication Data

US 2012/0223784 A1  Sep. 6, 2012

Related U.S. Application Data

(62) Division of application No. 13/044,769, filed on Mar. 10, 2011, now Pat. No. 8,304,968.

(30) Foreign Application Priority Data

Mar. 17, 2010 (JP) .................................. 2010-060326
Dec. 14, 2010 (JP) .................................. 2010-277758

(51) Int. Cl.
*H03H 9/215* (2006.01)
*H03H 9/05* (2006.01)
*H03H 9/10* (2006.01)

(52) U.S. Cl.
CPC ............ *H03H 9/215* (2013.01); *H03H 9/0514* (2013.01); *H03H 9/0547* (2013.01); *H03H 9/1021* (2013.01)
USPC ............................ 331/156; 310/370; 333/200

(58) Field of Classification Search
USPC ............................ 331/156; 310/370; 333/200
See application file for complete search history.

(56) References Cited

U.S. PATENT DOCUMENTS

| 7,368,861 | B2 | 5/2008 | Tanaya |
| 7,444,883 | B2 | 11/2008 | Novack |
| 7,626,318 | B2 | 12/2009 | Dalla Piazza et al. |
| 7,802,475 | B2 | 9/2010 | Nishizawa et al. |
| 2003/0056590 | A1 | 3/2003 | Yanagisawa et al. |
| 2006/0066185 | A1 | 3/2006 | Tanaya |
| 2012/0137775 | A1* | 6/2012 | Yamada ..................... 73/504.16 |

FOREIGN PATENT DOCUMENTS

| JP | 2003-156337 A | 5/2003 |
| JP | 2005-5896 | 1/2005 |
| JP | 2005-150992 A | 6/2005 |
| JP | 2006-311090 | 11/2008 |
| JP | 2009-27711 | 2/2009 |
| JP | 2009-201162 A | 9/2009 |
| JP | 2009253622 | 10/2009 |
| JP | 2009-284073 A | 12/2009 |

* cited by examiner

*Primary Examiner* — Joseph Chang
(74) *Attorney, Agent, or Firm* — Harness, Dickey & Pierce, P.L.C.

(57) ABSTRACT

A quartz crystal vibrator element having the weight section is provided with the intermediate weight section formed to have an arm width W1 larger (thicker) than the arm width W of the vibrating arm section and smaller (thinner) than the arm width W2 of the tip weight section, thereby making the intermediate weight section follow the vibration (the amplitude) of the vibrating arm section. Further, the tip weight section formed to have an arm width W2 larger (thicker) than the arm width W1 of the intermediate weight section is provided, thereby making the tip weight section follow the vibration (the amplitude) of the vibrating arm section and the intermediate weight section. Therefore, the vibration characteristics of the vibrating arm section can be stabilized.

17 Claims, 7 Drawing Sheets

US 8,847,694 B2

VIBRATOR ELEMENT, VIBRATOR, OSCILLATOR, AND ELECTRONIC APPARATUS

CROSS REFERENCE TO RELATED APPLICATIONS

This is a divisional application of U.S. Ser. No. 13/044,769 filed on Mar. 10, 2011 which claims priority to Japanese Patent Application No. 2010-277758 filed Dec. 14, 2010 and Japanese Patent Application No. 2010-060326 filed on Mar. 17, 2010, all of which are hereby expressly incorporated by reference in their entireties.

BACKGROUND

1. Technical Field

The present invention relates to a vibrator element, a vibrator and an oscillator each equipped with the vibrator element, and an electronic apparatus equipped with the oscillator.

2. Related Art

In the past, there has been disclosed a vibrator element having a weight section with an arm width rapidly increased to be large (thick) compared to the arm width of the vibrating arm section, the weight section being formed at the tip portion of the vibrating arm section of the vibrator element, to thereby achieve stabilization of the vibration of the vibrating arm section and the frequency of the vibrator element (see, e.g., JP-A-2005-5896 (pp. 5-7, FIGS. 1-5) and JP-A-2009-27711 (pp. 5-6, FIG. 1)). Further, there has been disclosed a vibrator element having the weight section formed to have an arm width gradually increasing from the tip portion of the vibrating arm section (see, e.g., JP-A-2006-311090 (pp. 6-7, FIG. 3)).

However, in the vibrator element of the related art, there is a case in which the weight section is difficult to follow the vibration (the amplitude) of the vibrating arm section, and if the weight section having a width rapidly increasing to be large (thick) is formed at the tip portion of the vibrating arm section, there arises a problem that the weight section fails to follow the vibration (the amplitude) of the vibrating arm section to thereby vibrate differently from the vibration of the vibrating arm section due to the inertia, which makes the vibration of the vibrating arm section unstable, or varies the vibrational frequency of the vibrating arm section. Further, in the case of providing the vibrating arm section with the weight section having the arm width gradually increasing from the tip portion of the vibrating arm section, although the vibration of the vibrating arm section is hardly destabilized, there arises a problem that the effect of lowering the frequency due to the formation of the weight section at the tip portion is degraded.

SUMMARY

An advantage of some aspects of the invention is to solve at least a part of the problem described above, and the invention can be implemented as the following embodiments or application examples.

Application Example 1

According to this application example of the invention, there is provided a vibrator element including a base portion, a plurality of vibrating arm sections extending from the base portion, an elongated groove section formed along a longitudinal direction of each of the vibrating arm sections, an intermediate weight section having an arm width larger than an arm width of each of the vibrating arm sections, and formed on a tip side of each of the vibrating arm sections, and a tip weight section having an arm width larger than the arm width of the intermediate weight section, and formed on a tip side of the intermediate weight section.

According to this application example of the invention, the vibrator element is provided with the intermediate weight section formed to have an arm width larger (thicker) than the arm width of the vibrating arm section and smaller (thinner) than the arm width of the tip weight section, thereby making the intermediate weight section follow the vibration (the amplitude) of the vibrating arm section. Further, the tip weight section formed to have an arm width larger (thicker) than the arm width of the intermediate weight section is provided, thereby making the tip weight section follow the vibration (the amplitude) of the vibrating arm section and the intermediate weight section. Therefore, the vibration of the vibrating arm section and the vibrational frequency of the vibrator element can be stabilized. Further, the vibrator element is provided with the intermediate weight section to thereby obtain a frequency reduction effect as well.

Application Example 2

According to this application example of the invention, in the vibrator element of the above application example of the invention, it is preferable to further include a first widening section disposed between the vibrating arm section and the intermediate weight section and having an arm width gradually increasing from the arm width of the vibrating arm section to the arm width of the intermediate weight section.

According to this application example of the invention, by gradually increasing the arm width of the first widening section from the arm width of the vibrating arm section to the arm width of the intermediate weight section in accordance with the difference between the arm width of the vibrating arm section and the arm width of the intermediate weight section, the quartz crystal vibrator element can obtain an advantage of suppressing the asymmetry property of the etching due to the anisotropy of, for example, the vibrator element material. Therefore, it is possible to provide the symmetry property with respect to the vibration direction (the amplitude direction) between the vibrating arm section and the intermediate weight section. Thus, the balance can be maintained between the vibrating arm sections, and thus the vibration characteristics of the vibrator element can be stabilized.

Application Example 3

According to this application example of the invention, in the vibrator element of the above application example of the invention, it is preferable to further include a second widening section disposed between the intermediate weight section and the tip weight section, and having an arm width gradually increasing from the arm width of the intermediate weight section to the arm width of the tip weight section.

According to this application example of the invention, by gradually increasing the arm width of the second widening section from the arm width of the intermediate weight section to the arm width of the tip weight section in accordance with the difference between the arm width of the intermediate weight section and the arm width of the tip weight section, the quartz crystal vibrator element can obtain an advantage of suppressing the asymmetry property of the etching due to the anisotropy of, for example, the vibrator element material. Therefore, it is possible to provide the symmetry property with respect to the vibration direction (the amplitude direction) between the intermediate weight section and the tip weight section. Thus, the highly accurate balance can be maintained between the vibrating arm sections, and thus the vibration characteristics of the vibrator element can further be stabilized.

Application Example 4

According to this application example of the invention, there is provided a vibrator including the vibrator element according to any one of the application examples of the invention described above, and a package adapted to house the vibrator element.

According to this application example of the invention, since the vibrator element has the intermediate weight section, the intermediate weight section is made to follow the vibration (the amplitude) of the vibrating arm section, and further, since the vibrator element further has the tip weight section, the tip weight section is made to follow the vibration (the amplitude) of the vibrating arm section and the intermediate weight section. Thus, the vibrator has the stabilized vibrational frequency, and can obtain the frequency reduction effect.

Application Example 5

According to this application example of the invention, there is provided an oscillator including the vibrator element according to any one of the application examples of the invention described above, a circuit section electrically connected to the vibrator element, and a package adapted to house the vibrator element and the circuit section.

According to this application example of the invention, since the vibrator element having the stabilized vibrational frequency and the frequency reduction effect and the circuit section are provided, the oscillator can be provided with superior oscillation characteristics.

Application Example 6

According to this application example of the invention, there is provided an electronic apparatus including the vibrator element according to any one of the application examples of the invention described above, and a circuit section electrically connected to the vibrator element.

According to this application example of the invention, since the vibrator element having the stabilized vibrational frequency and the frequency reduction effect and the circuit section are provided, the electronic apparatus can achieve a high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

In the explanation of the following embodiments, a quartz crystal vibrator element using quartz crystal as a piezoelectric material is cited as an example of the vibrator element. Further, the quartz crystal vibrator (the vibrator) and a quartz crystal oscillator (the oscillator) each equipped with the quartz crystal vibrator element, and an electronic apparatus equipped with the quartz crystal oscillator will be explained.

First Embodiment

A first embodiment of the invention will hereinafter be explained with reference to FIGS. 1A through 1C.

Figure 1A:
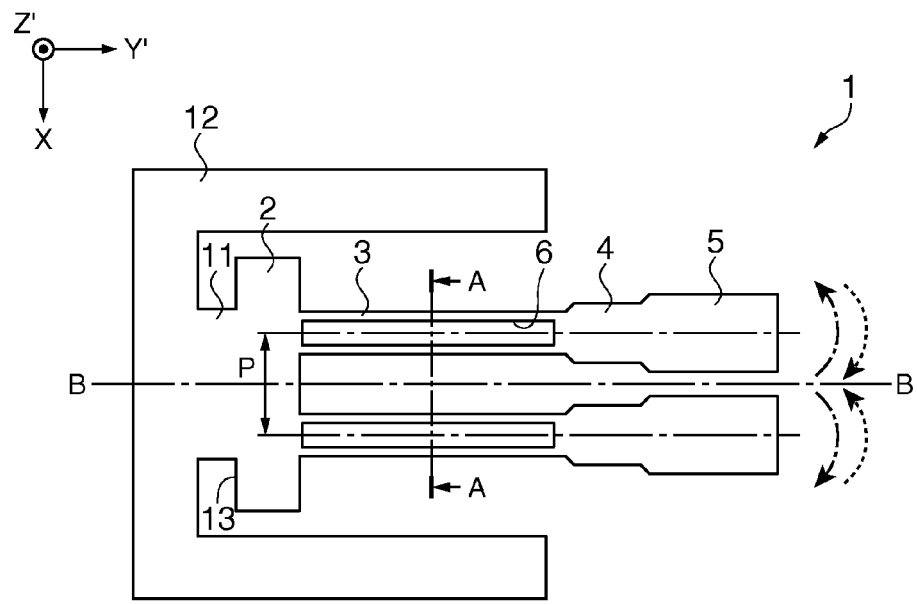
FIGS. 1A through 1C are schematic configuration diagrams showing a quartz crystal vibrator element according to a first embodiment of the invention.

FIG. 1A is a schematic plan view showing the quartz crystal vibrator element according to the first embodiment. FIG. 1B is a partial enlarged view of the quartz crystal vibrator element shown in FIG. 1A. FIG. 1C is a cross-sectional view along the line A-A shown in FIG. 1A.

As shown in FIG. 1A, the quartz crystal vibrator element 1 as the vibrator element is provided with the base portion 2, two vibrating arm sections 3, two intermediate weight sections 4, two tip weight sections 5, elongated groove sections 6, a coupling section 11, and a support section 12. The quartz crystal vibrator element 1 has a Z-axis as an optical axis of the quartz crystal column, an X-axis as an electrical axis perpendicular to the Z-axis, and a Y-axis as a mechanical axis perpendicular to the x-axis, and is cut out from a Z-cut quartz crystal plate along a plane obtained by tilting the X-Y plane 5 degrees from the angle of 0 degree around the X-axis viewed from the intersection (the coordinate origin) between the X-axis and the Y-axis. As shown in FIGS. 1A through 1C, the width direction of the base portion 2 corresponds to the X-axis, the longitudinal direction of the vibrating arm section 3 corresponds to a Y'-axis direction, and the thickness direction of the quartz crystal vibrator element 1 corresponds to a Z'-axis direction.

The coupling section 11 of the quartz crystal vibrator element 1 is formed so as to extend from the base portion 2. The support section 12 is formed so as to extend from the coupling section 11. The coupling section 11 is formed to have a dimension in the vertical direction shown in the drawing smaller than the dimension of the base portion 2 and the dimension of the support section 12 in the vertical direction shown in the drawing. Thus, cut sections 13 are formed between the base portion 2 and the support section 12.

Figure 1B:
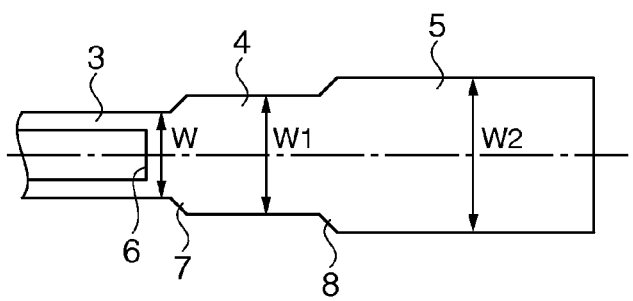

The two vibrating arm sections 3 are formed so as to extend from the base portion 2 in parallel to each other to have an arm width W (FIG. 1B). It should be noted that the expression of "in parallel to each other" denotes the state in which the respective extending directions of the vibrating arm sections 3 are parallel to each other. The vibrating arm sections 3 are formed axisymmetrically about the dashed dotted line denoted by B-B. The two vibrating arm sections 3 are disposed at a pitch P.

The intermediate weight sections 4 each have an arm width W1 larger than the arm width W of the vibrating arm section 3, and are formed on the top side of the vibrating arm sections 3. The tip weight sections 5 each have an arm width W2 larger than the arm width W1 of the intermediate weight section 4, and are formed on the tip side of the intermediate weight sections 4. The intermediate weight sections 4 and the tip weight sections 5 are each formed axisymmetrically about the dashed dotted line denoted by B-B.

As shown in FIG. 1B, between the vibrating arm section 3 and the intermediate weight section 4 there is formed a first widening section 7 having an arm width gradually increasing from the arm width W of the vibrating arm section 3 to the arm width W1 of the intermediate weight section 4. Further, between the intermediate weight section 4 and the tip weight section 5, there is formed a second widening section 8 for gradually increasing the arm width from the arm width W1 of the intermediate weight section 4 to the arm width W2 of the tip weight section 5.

In the present embodiment, the positions bisecting the respective arm widths W, W1, and W2 are arranged so as to line on the straight line illustrated with the dashed dotted line shown in FIG. 1B. In other words, the vibrating arm section 3, the intermediate weight section 4, and the tip weight section 5 are each formed axisymmetrically about the dashed dotted line shown in FIG. 1B. Further, since the tip weight sections 5 are formed axisymmetrically about the dashed dotted line denoted as B-B in FIG. 1A, the arm width W2 of the tip weight section 5 takes a value smaller than the pitch P of the vibrating arm sections 3.

The elongated groove section 6 is formed along the longitudinal direction of the vibrating arm section 3. As shown in FIG. 1C, the elongated groove section 6 is provided to each of the surfaces having the arm width W. Further, the elongated groove section 6 is formed axisymmetrically about the dashed dotted line shown in FIG. 1B.

Figure 1C:
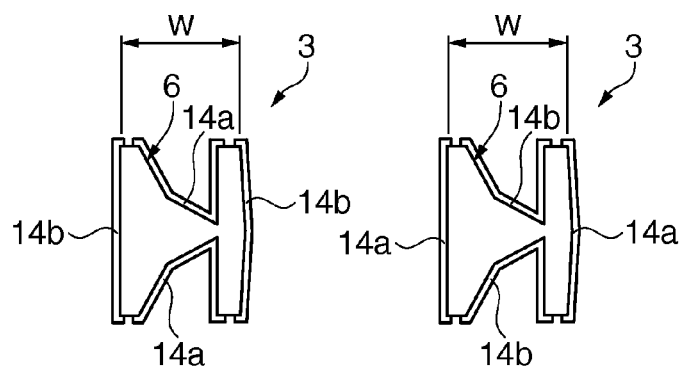

As shown in FIG. 1C, excitation electrodes 14a, 14b are provided to the respective vibrating arm sections 3 and the elongated groove sections 6. Further, the layouts of the respective excitation electrodes 14a, 14b are reverse to each other between the vibrating arm section 3 (the elongated groove sections 6) on the left side and the vibrating arm section 3 (the elongated groove sections 6) on the right side. Specifically, the excitation electrode 14a is disposed in each of the elongated groove sections 6 on the left side of the drawing, while the excitation electrode 14b is disposed in each of the elongated groove sections 6 on the right side of the drawing. Further, the excitation electrodes 14b are disposed in the vibrating arm section 3 on the left side of the drawing, while the excitation electrodes 14a are disposed in the vibrating arm section 3 on the right side of the drawing.

The electrical field is generated by making the current flow between the excitation electrode 14a and the excitation electrode 14b, and the vibrating arm section 3 vibrates due to the piezoelectric effect to drive the quartz crystal vibrator element 1 as illustrated with the dashed dotted arrows and the dashed arrows in FIG. 1A.

According to the present embodiment, the quartz crystal vibrator element 1 is provided with the intermediate weight section 4 formed to have an arm width W1 larger (thicker) than the arm width W of the vibrating arm section 3 and smaller (thinner) than the arm width W2 of the tip weight section 5, thereby making the intermediate weight section 4 follow the vibration (the amplitude) of the vibrating arm section 3. Further, the quartz crystal vibrator element 1 is provided with the tip weight section 5 formed to have an arm width W2 larger (thicker) than the arm width W1 of the intermediate weight section 4, thereby making the tip weight section 5 follow the vibration (the amplitude) of the vibrating arm section 3 and the intermediate weight section 4. Thus, the vibration of the vibrating arm section 3 and the vibrational frequency of the quartz crystal vibrator element 1 can be stabilized.

Further, by gradually increasing the arm width of the first widening section 7 from the arm width W of the vibrating arm section 3 to the arm width W1 of the intermediate weight section 4 in accordance with the difference between the arm width W of the vibrating arm section 3 and the arm width W1 of the intermediate weight section 4, the quartz crystal vibrator element 1 suppresses the asymmetry property of the etching due to the anisotropy of the quartz crystal as the piezoelectric material. Therefore, it is possible to provide the symmetry property with respect to the vibration direction (the amplitude direction) between the vibrating arm section 3 and the intermediate weight section 4. Thus, balance can be maintained between the two vibrating arm sections 3, thereby making it possible to stabilize the vibration characteristics of the quartz crystal vibrator element 1.

Further, by gradually increasing the arm width of the second widening section 8 from the arm width W1 of the intermediate weight section 4 to the arm width W2 of the tip weight section 5 in accordance with the difference between the arm width W1 of the intermediate weight section 4 and the arm width W2 of the tip weight section 4, the quartz crystal vibrator element 1 suppresses the asymmetry property of the etching due to the anisotropy of the quartz crystal as the piezoelectric material. Therefore, it is possible to provide the symmetry property with respect to the vibration direction (the amplitude direction) between the intermediate weight section 4 and the tip weight section 5. Thus, highly accurate balance can be maintained between the two vibrating arm sections 3, thereby making it possible to further stabilize the vibration characteristics of the quartz crystal vibrator element 1.

Some modified examples regarding the intermediate weight sections 4 and the tip weight sections 5 in the first embodiment will hereinafter be explained with reference to FIGS. 2A through 2E.

First Modified Example

Figure 2A:
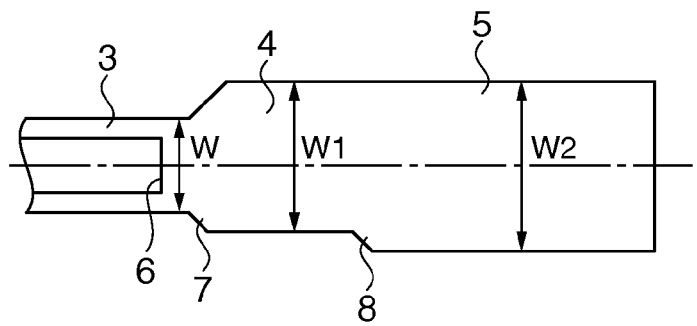
FIGS. 2A through 2E are schematic plan views showing modified examples regarding an intermediate weight section and a tip weight section in the first embodiment.

FIG. 2A shows a first modified example. As shown in FIG. 2A, the intermediate weight section 4 of the first modified example is not formed axisymmetrically about the dashed dotted line, while the tip weight section 5 is formed axisymmetrically about the dashed dotted line. Further, one end of the intermediate weight section 4 defining the arm width W1 and one end of the tip weight section 5 defining the arm width W2 are formed on the same straight line.

Further, in the first modified example, although it is assumed that the intermediate weight section 4 is not formed axisymmetrically about the dashed dotted line, the configuration is not limited thereto, but it is also possible to assume that the intermediate weight section 4 is formed axisymmetrically about the dashed dotted line, while the tip weight section 5 is not formed axisymmetrically about the dashed dotted line.

Second Modified Example

Figure 2B:
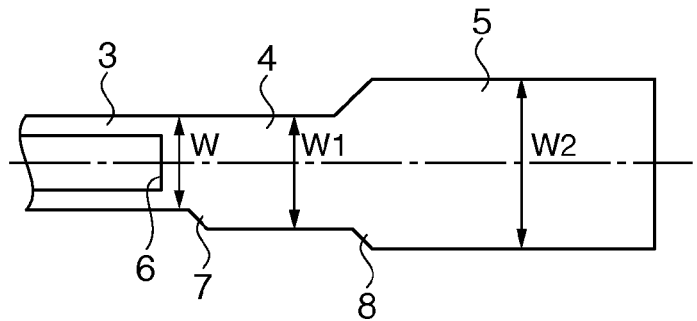

FIG. 2B shows a second modified example. As shown in FIG. 2B, the intermediate weight section 4 of the second modified example is not formed axisymmetrically about the dashed dotted line, while the tip weight section 5 is formed axisymmetrically about the dashed dotted line similarly to the case of the first modified example.

Further, the difference from the modified example 1 is the point that one end of the intermediate weight section 4 defining the arm width W1 and one end of the vibrating arm section 3 defining the arm width W are formed on the same straight line.

Figure 2C:
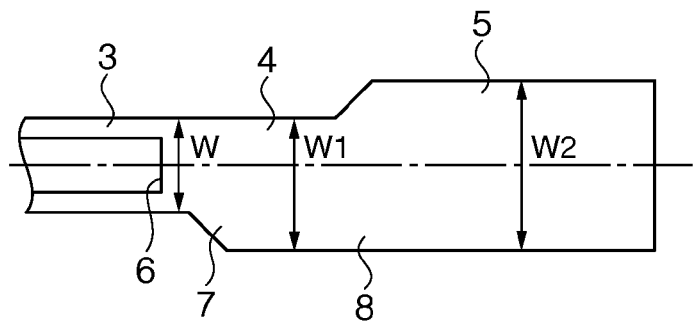

Further, in the second modified example, although it is assumed that the one end of the intermediate weight section 4 defining the arm width W1 is formed on the same straight line with the one end of the vibrating arm section 3 defining the arm width W, the configuration is not limited thereto, but it is also possible to assume that the one end of the intermediate weight section 4 defining the arm width W1 is formed on the same straight line with one end of the tip weight section 5 defining the arm width W2 as shown in FIG. 2C.

Third Modified Example

Figure 2D:
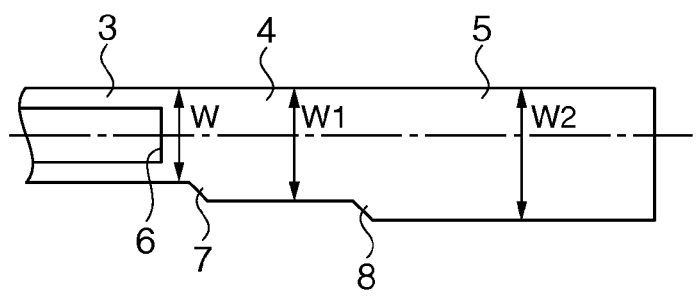

FIG. 2D shows a third modified example. As shown in FIG. 2D, the intermediate weight section 4 and the tip weight section 5 of the third modified example are not formed axisymmetrically about the dashed dotted line. One end of the intermediate weight section 4 defining the arm width W1 and one end of the tip weight section 5 defining the arm width W2 are formed on the same straight line as the one end of the vibrating arm section 3 defining the arm width W.

Fourth Modified Example

Figure 2E:
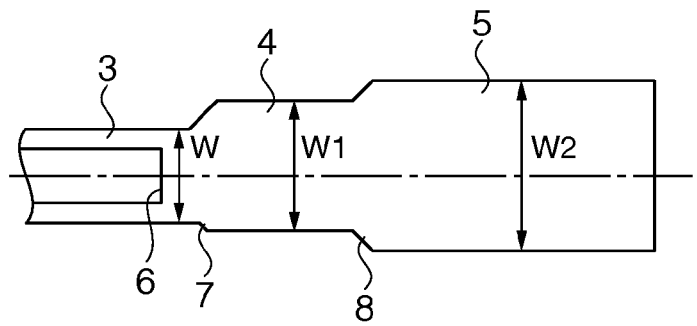

FIG. 2E shows a fourth modified example. As shown in FIG. 2E, both of the intermediate weight section 4 and the tip weight section 5 are not formed axisymmetrically about the dashed dotted line. Further, the difference from the first through third modified examples is the point that the one end and the other end of the vibrating arm section 3 defining the arm width W, the one end and the other end of the intermediate weight section 4 defining the arm width W1, and the one end and the other end of the tip weight section 5 defining the arm width W2 are not formed on the same straight lines, respectively.

Further, in the fourth modified example, although it is assumed that both of the intermediate weight section 4 and the tip weight section 5 are not formed axisymmetrically about the dashed dotted line, the configuration is not limited thereto, but it is also possible to assume that either one of the intermediate weight section 4 and the tip weight section 5 is not formed axisymmetrically about the dashed dotted line, while the other is formed axisymmetrically about the dashed dotted line.

Second Embodiment

A second embodiment of the invention will hereinafter be explained with reference to FIGS. 3A and 3B.

The second embodiment relates to a quartz crystal vibrator using the quartz crystal vibrator element 1 according to the first embodiment shown in FIGS. 1A through 1C, the constituents identical to those of the first embodiment are denoted by the same reference numerals, and the explanations of the constituents will be omitted.

Figure 3A:
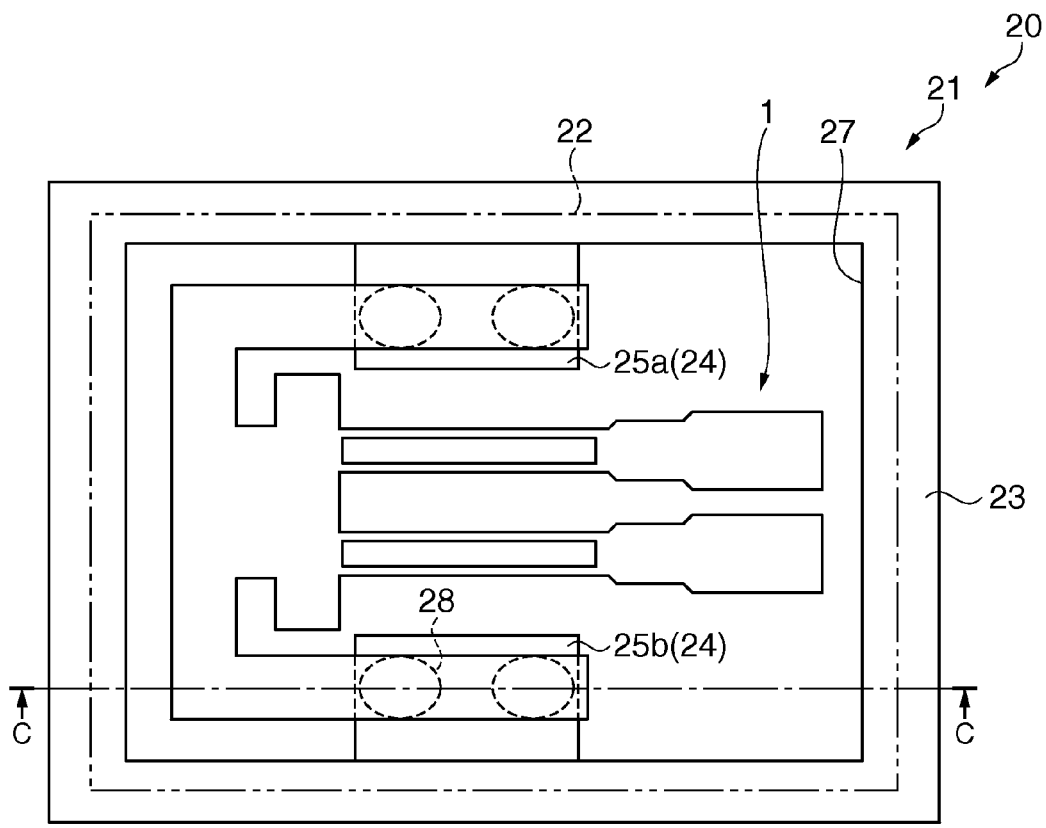
FIGS. 3A and 3B are schematic configuration diagrams showing a quartz crystal vibrator according to a second embodiment of the invention.

FIG. 3A is a schematic plan view showing the quartz crystal vibrator according to the second embodiment. FIG. 3B is a cross-sectional view along the line C-C shown in FIG. 3A.

The quartz crystal vibrator 20 according to the second embodiment is provided with a package 21 for housing the quartz crystal vibrator element 1 according to the first embodiment.

Figure 3B:
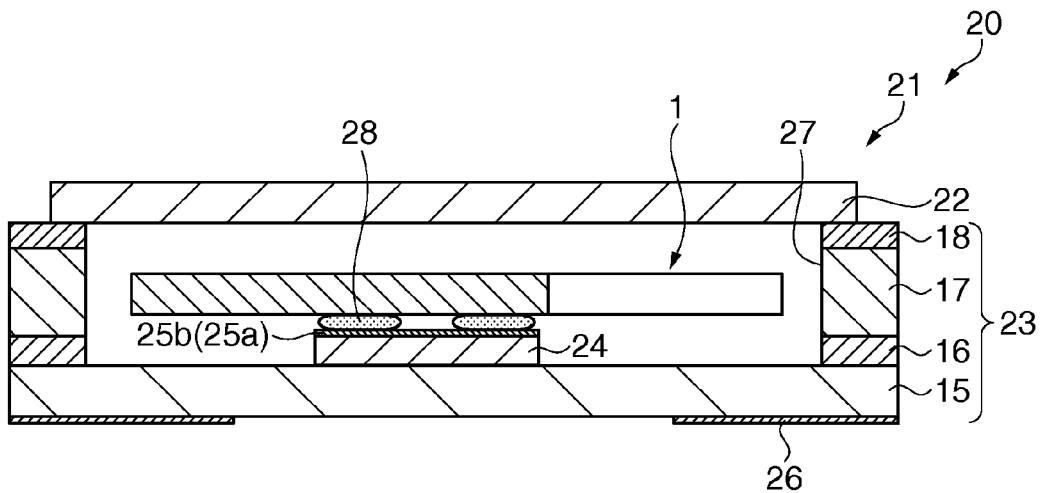

As shown in FIGS. 3A and 3B, the quartz crystal vibrator 20 is provided with the quartz crystal vibrator element 1 and the package 21, and the quartz crystal vibrator element 1 is housed in the package 21 in an airtight manner. The package 21 is provided with the base 23 and the lid member 22.

The base 23 is provided with a base substrate 15, layer substrates 16, 17, a bonding section 18, conductive fixing sections 25a, 25b, external connection terminals 26, and a housing chamber 27.

The base 23 is formed by sequentially stacking the layer substrates 16, 17 on the base substrate 15, and then forming the bonding section 18 made of metal, soldering material, glass or the like on the layer substrate 17. The base substrate 15 and the layer substrates 16, 17 are formed of a ceramic sheet made of an aluminum oxide material as an insulating material, for example. The housing chamber 27 is formed by hollowing out the layer substrates 16, 17 so as to conform with the shape of the housing chamber 27, stacking the layer substrates 16, 17 on the base substrate 15, and then sintering the constituents.

There are provided two projection sections 24 formed of the base substrate 15 extending inside the housing chamber 27. On the projection sections 24, there are formed the conductive fixing sections 25a, 25b, respectively. The conductive fixing sections 25a, 25b are formed by sequentially performing the processes of, for example, tungsten metalizing, nickel plating, and gold plating.

Two external connection terminals 26 are provided, and are formed on the lower surface of the base substrate 15, the outside of the base 23, namely the surface opposed to the housing chamber 27. The external connection terminals 26 are formed on the lower surface of the base substrate 15 by sequentially performing the processes of, for example, tungsten metalizing, nickel plating, and gold plating.

Further, the external connection terminals 26 are electrically connected to the conductive fixing sections 25 via, for example, wiring (not shown) provided to the base substrate 15.

The support section 12 of the quartz crystal vibrator element 1 is provided with mounting electrodes (not shown) and are connected respectively to the excitation electrodes 14a, 14b. The quartz crystal vibrator element 1 is fixed to the conductive fixing sections 25 with an electrically conductive adhesive 28, and is disposed inside the housing chamber 27 provided to the base 23. In such a manner as described above, the excitation electrodes 14a, 14b are electrically connected respectively to the conductive fixing sections 25a, 25b, and further electrically connected respectively to the external connection terminals 26.

The electrically conductive adhesive 28 is made of, for example, silicon resin, epoxy resin, or polyimide resin, and contains a combination of electrically conductive powder such as silver (Ag) or platinum (Pt).

The base 23 is bonded to the lid member 22 with the bonding section 18. In such a manner as described above, the quartz crystal vibrator element 1 is encapsulated in the housing chamber 27 in an airtight manner with the base 23 and the lid member 22.

The lid member 22 is made of metal such as iron (Fe), cobalt (Co), or nickel (Ni), an alloy containing a combination of any of these metals, ceramics composed of an aluminum oxide material, or glass.

According to the present embodiment, the quartz crystal vibrator element 1 provided to the quartz crystal vibrator 20 is provided with the intermediate weight section 4 formed to have an arm width W1 larger (thicker) than the arm width W of the vibrating arm section 3 and smaller (thinner) than the arm width W2 of the tip weight section 5, thereby making the intermediate weight section 4 follow the vibration (the amplitude) of the vibrating arm section 3. Further, since the quartz crystal vibrator element 1 is provided with the tip weight section 5 formed to have an arm width W2 larger (thicker) than the arm width W1 of the intermediate weight section 4, thereby making the tip weight section 5 follow the vibration (the amplitude) of the vibrating arm section 3 and the intermediate weight section 4, it is possible to obtain the quartz crystal vibrator 20 with the vibration of the vibrating arm section 3 and the vibrational frequency of the quartz crystal vibrator element 1 stabilized.

Further, by gradually increasing the arm width of the first widening section 7 from the arm width W of the vibrating arm section 3 to the arm width W1 of the intermediate weight section 4 in accordance with the difference between the arm width W of the vibrating arm section 3 and the arm width W1 of the intermediate weight section 4, the quartz crystal vibrator element 1 suppresses the asymmetry property of the etching due to the anisotropy of the quartz crystal as the piezoelectric material. Therefore, it is possible to provide the symmetry property with respect to the vibration direction (the amplitude direction) between the vibrating arm section 3 and the intermediate weight section 4. Thus, the balance can be maintained between the two vibrating arm sections 3, thereby making it possible to obtain the quartz crystal vibrator 20, which stabilizes the vibration characteristics of the quartz crystal vibrator element 1.

Further, by gradually increasing the arm width of the second widening section 8 from the arm width W1 of the intermediate weight section 4 to the arm width W2 of the tip weight section 5 in accordance with the difference between the arm width W1 of the intermediate weight section 4 and the arm width W2 of the tip weight section 5, the quartz crystal vibrator element 1 suppresses the asymmetry property of the etching due to the anisotropy of the quartz crystal as the piezoelectric material. Therefore, it is possible to provide the symmetry property with respect to the vibration direction (the amplitude direction) between the intermediate weight section 4 and the tip weight section 5. Thus, the highly accurate balance can be maintained between the two vibrating arm sections 3, thereby making it possible to obtain the quartz crystal vibrator 20, which further stabilizes the vibration characteristics of the quartz crystal vibrator element 1.

Third Embodiment

A third embodiment of the invention will hereinafter be explained with reference to FIG. 4.

The third embodiment relates to a quartz crystal oscillator using the quartz crystal vibrator element 1 according to the first embodiment shown in FIGS. 1A through 1C, the constituents identical to those of the first embodiment are denoted by the same reference numerals, and the explanations of the constituents will be omitted.

The point in which the quartz crystal oscillator according to the third embodiment is different from the quartz crystal vibrator 20 according to the second embodiment is that the quartz crystal oscillator is further provided with a drive circuit (a circuit section) for driving the quartz crystal vibrator 20.

Figure 4:
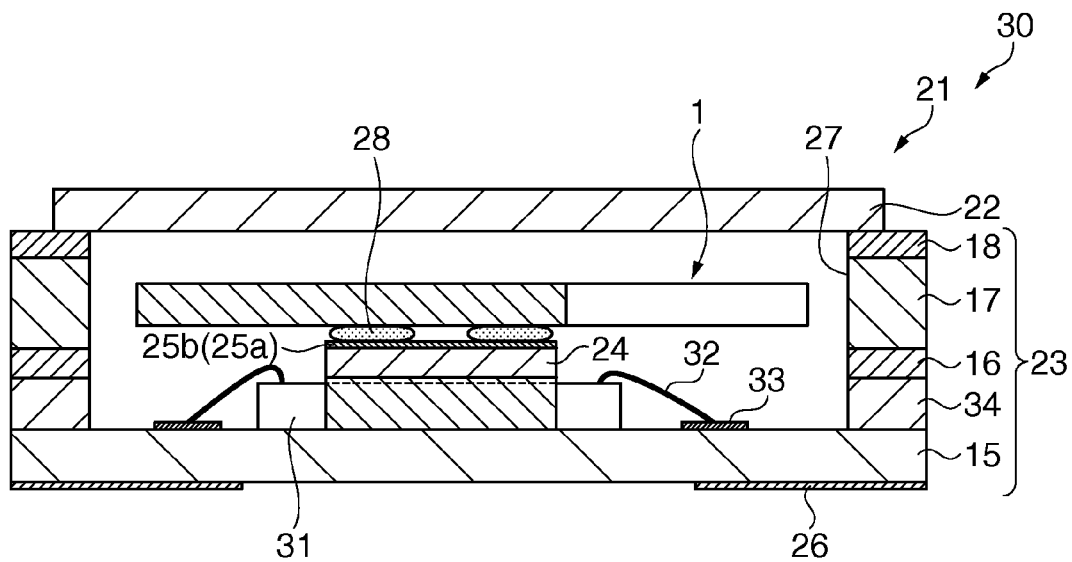
FIG. 4 is a schematic cross-sectional view showing a quartz crystal oscillator according to a third embodiment.

FIG. 4 is a schematic cross-sectional view showing the quartz crystal oscillator according to the third embodiment. As shown in FIG. 4, the quartz crystal oscillator 30 is provided with the quartz crystal vibrator element 1, the package 21, and the drive circuit (the circuit section) 31 electrically connected to the quartz crystal vibrator element 1. The quartz crystal vibrator element 1 and the drive circuit 31 are housed in the package 21 in an airtight manner. The package 21 is provided with the base 23 and the lid member 22.

The base 23 is provided with a layer substrate 34. The base 23 is formed by sequentially stacking the layer substrates 34, 16, and 17 on the base substrate 15, and then forming the bonding section 18 made of metal, soldering material, glass or the like on the layer substrate 17.

The drive circuit 31 is die-attached to the surface of the base substrate 15, and is connected to the internal connection terminals 33 via bonding wires 32.

The conductive fixing sections 25 are formed on the projection sections 24 of the base substrate 15 inside the housing chamber 27. A plurality of internal connection terminals 33 is provided, and is formed on the upper surface of the base substrate 15, which is the inside of the base 23, namely inside the housing chamber 27. The internal connection terminals 33 are formed on the upper surface of the base substrate 15 by sequentially performing the processes of, for example, tungsten metalizing, nickel plating, and gold plating.

Further, the internal connection terminals 33 are electrically connected to the conductive fixing sections 25 and the external connection terminals 26 via, for example, wiring (not shown) provided to the base substrate 15.

According to the present embodiment, the quartz crystal vibrator element 1 provided to the quartz crystal oscillator 30 is provided with the intermediate weight section 4 formed to have an arm width W1 larger (thicker) than the arm width W of the vibrating arm section 3 and smaller (thinner) than the arm width W2 of the tip weight section 5, thereby making the intermediate weight section 4 follow the vibration (the amplitude) of the vibrating arm section 3. Further, the quartz crystal vibrator element 1 is provided with the tip weight section 5 formed to have an arm width W2 larger (thicker) than the arm width W1 of the intermediate weight section 4, thereby making the tip weight section 5 follow the vibration (the amplitude) of the vibrating arm section 3 and the intermediate weight section 4. Thus, the quartz crystal oscillator 30 with the vibration of the vibrating arm section 3 and the vibrational frequency of the quartz crystal vibrator element 1 stabilized can be obtained.

Further, by gradually increasing the arm width of the first widening section 7 from the arm width W of the vibrating arm section 3 to the arm width W1 of the intermediate weight section 4 in accordance with the difference between the arm width W of the vibrating arm section 3 and the arm width W1 of the intermediate weight section 4, the quartz crystal vibrator element 1 suppresses the asymmetry property of the etching due to the anisotropy of the quartz crystal as the piezoelectric material. Therefore, it is possible to provide the symmetry property with respect to the vibration direction (the amplitude direction) between the vibrating arm section 3 and the intermediate weight section 4. Thus, the balance can be maintained between the two vibrating arm sections 3, and thus the quartz crystal oscillator 30, which stabilizes the vibration characteristics of the quartz crystal vibrator element 1, can be obtained.

Further, by gradually increasing the arm width of the second widening section 8 from the arm width W1 of the intermediate weight section 4 to the arm width W2 of the tip weight section 5 in accordance with the difference between the arm width W1 of the intermediate weight section 4 and the arm width W2 of the tip weight section 5, the quartz crystal vibrator element 1 suppresses the asymmetry property of the etching due to the anisotropy of the quartz crystal as the piezoelectric material. Therefore, it is possible to provide the symmetry property with respect to the vibration direction (the amplitude direction) between the intermediate weight section 4 and the tip weight section 5. Thus, the highly accurate balance can be maintained between the two vibrating arm sections 3, thereby making it possible to obtain the quartz crystal oscillator 30, which further stabilizes the vibration characteristics of the quartz crystal vibrator element 1.

Electronic Apparatus

Figure 5:
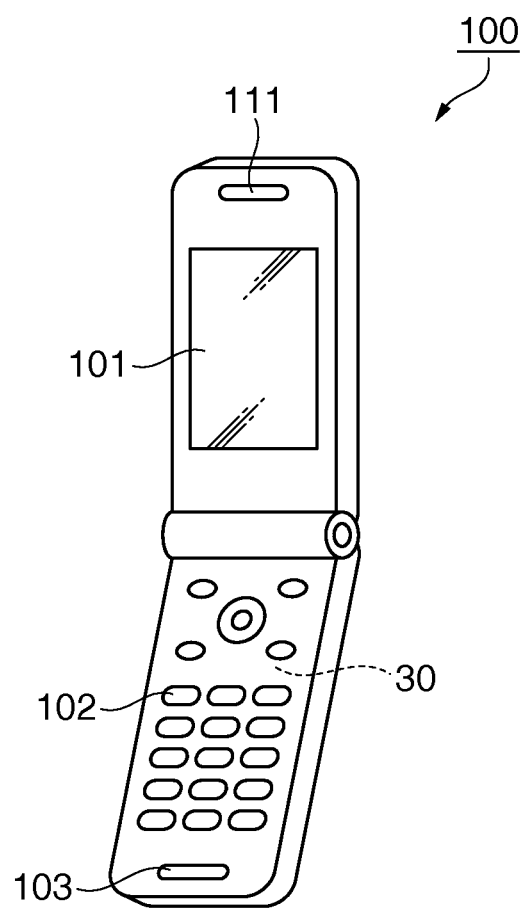
FIG. 5 is a perspective view schematically showing a cellular phone as an example of an electronic apparatus.
Figure 6:
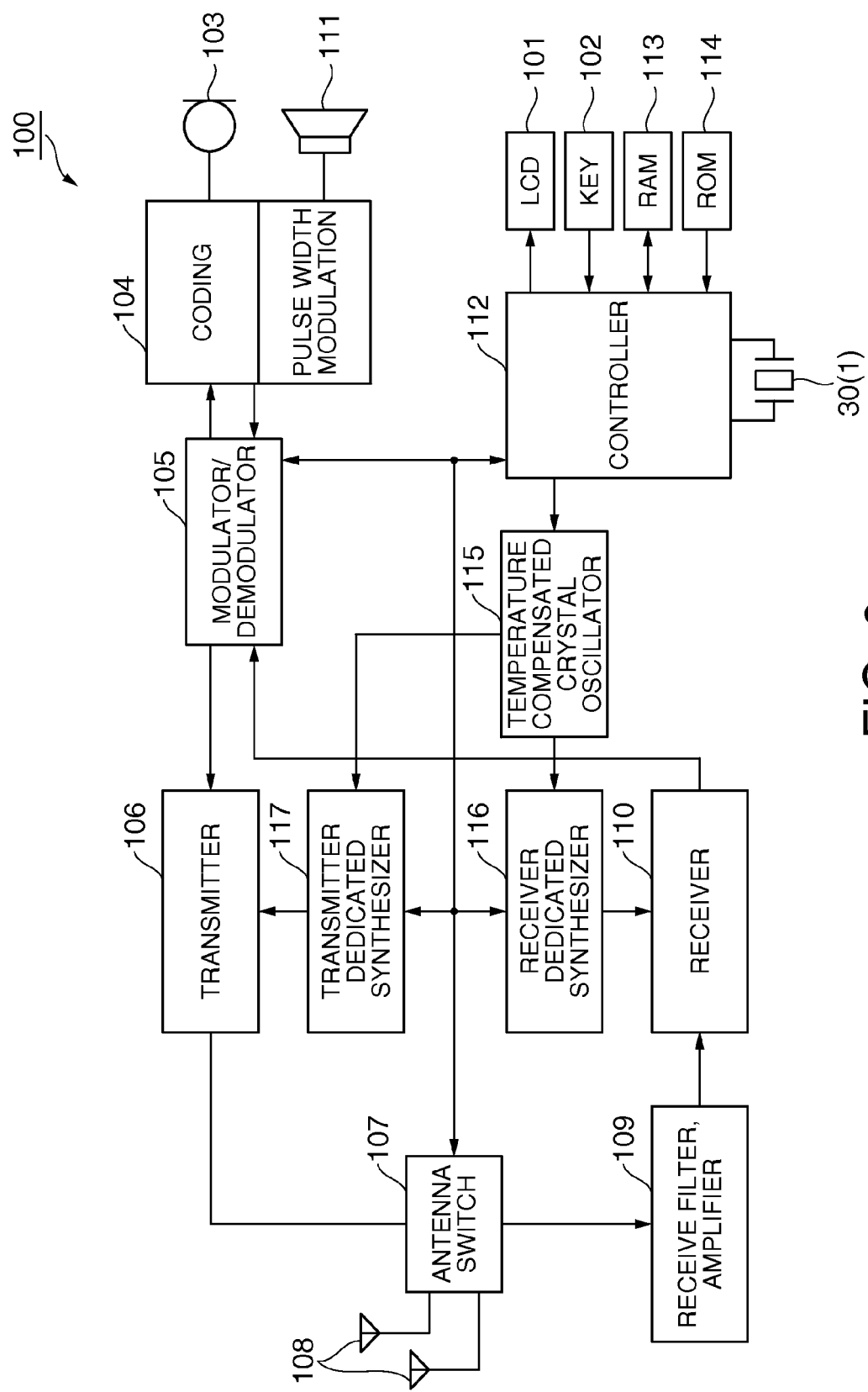
FIG. 6 is a circuit block diagram of the cellular phone.

The quartz crystal oscillator 30 according to the embodiment described above can be applied to various types of electronic apparatus, and the electronic apparatuses become highly reliable. FIGS. 5 and 6 show a cellular phone as an example of the electronic apparatus according to the invention. FIG. 5 is a perspective view showing a schematic appearance of the cellular phone, and FIG. 6 is a circuit block diagram for explaining a circuit configuration of the cellular phone. The cellular phone 100 will be explained as an example of using the quartz crystal oscillator 30 using the quartz crystal vibrator element 1 (FIGS. 1A through 1C), and regarding the configuration and the operation of the quartz crystal oscillator 30, the same reference numerals are used, and therefore, the explanation therefor will be omitted.

As shown in FIG. 5, the cellular phone 100 is provided with a liquid crystal display (LCD) 101 as the display section, keys 102 as an input section of the numerical characters and so on, a microphone 103, a speaker 111, and so on. Further, as shown in FIG. 6, in the case of performing the transmission in the cellular phone 100, when the user inputs his or her voice to the microphone 103, it results that the signal passes through the pulse width modulation/coding block 104 and the modulator/demodulator block 105, and is then transmitted from the antenna 108 via a transmitter 106 and an antenna switch 107.

Incidentally, a signal transmitted from a cellular phone of another person is received by the antenna 108, and then input from a receiver 110 to the modulator/demodulator block 105 via the antenna switch 107 and a receive filter 109. Further, it is arranged that the signal modulated or demodulated passes through the pulse width modulation/coding block 104, and is then output from the speaker 111 as a voice. Further, there is provided a controller 112 for controlling the antenna switch 107, the modulator/demodulator block 105, and so on.

The controller 112 also controls the LCD 101 as the display section, the keys 102 as the input section for the numerical characters and so on, and further a RAM 113, a ROM 114, and so on besides the constituents described above, and is therefore required to be highly accurate. Further, improvement in the reliability of the cellular phone 100 is also required, and as the device satisfying such a requirement, the quartz crystal oscillator 30 having the quartz crystal vibrator element 1 with the vibrational frequency stabilized is used. It should be noted that although the cellular phone 100 is also provided with a temperature compensated crystal oscillator 115, a receiver dedicated synthesizer 116, a transmitter dedicated synthesizer 117, and so on as additional constituent blocks, the explanation therefor will be omitted here.

Figure 7:
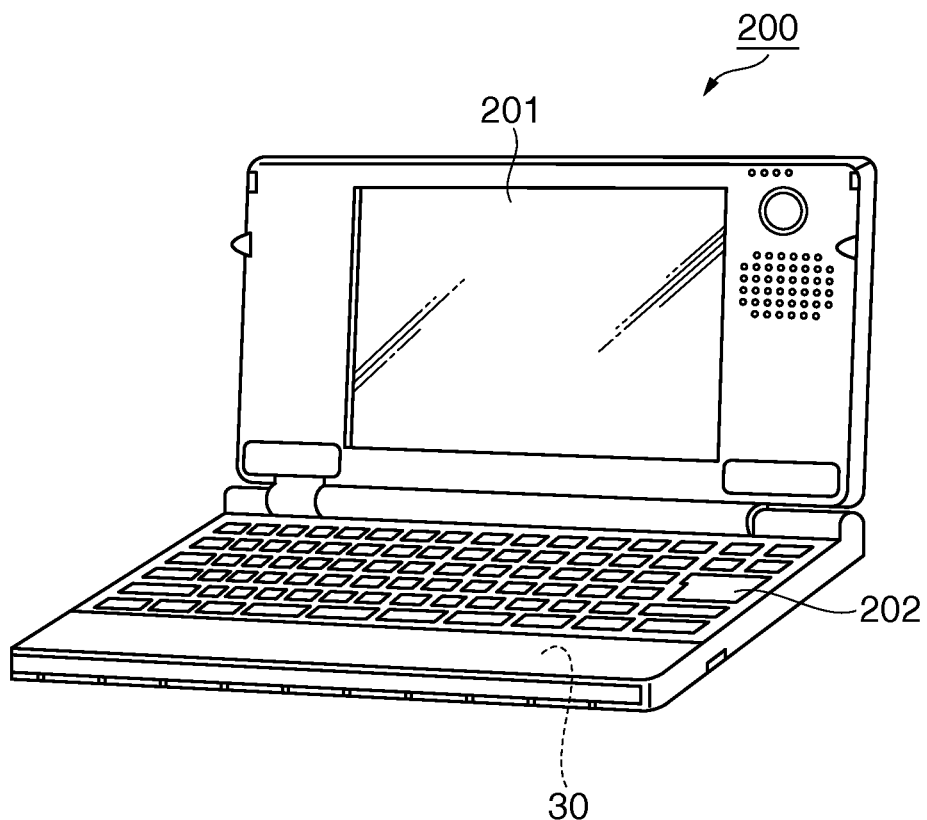
FIG. 7 is a perspective view schematically showing a personal computer as an example of the electronic apparatus.

Further, as the electronic device equipped with the quartz crystal oscillator 30 according to the invention, there can also be cited a personal computer (a mobile personal computer) 200 shown in FIG. 7. The personal computer 200 is provided with a display section 201, an input key section 202, and so on, and the quartz crystal oscillator 30 with the stabilized vibrational frequency is used as the reference clock for electrical control therefor.

The quartz crystal vibrator element 1 of the quartz crystal oscillator 30 used in the cellular phone 100 or the personal computer 200 described above has the first widening section 7, the intermediate weight section 4, the second widening section 8, and the tip weight section 5 in the tip portion of the vibrating arm section 3, and is capable of keeping the stable vibrational frequency due to these constituents. Therefore, it is possible for the cellular phone 100 and the personal computer 200 to achieve a high reliability.

It should be noted that, as the electronic apparatus provided with the quartz crystal oscillator 30 according to the invention, there can be cited in addition to the devices described above, for example, a digital still camera, an inkjet ejection device (e.g., an inkjet printer), a laptop personal computer, a television set, a video camera, a video cassette recorder, a car navigation system, a pager, a personal digital assistance (including one with communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator.

Although the electronic apparatuses according to the invention are described based on the embodiments shown in the accompanying drawings as described above, the present invention is not limited to these embodiments, but the configuration of each of the components can be replaced with one having an identical function and any configuration. Further, it is possible to add any other constituents to the invention. For example, although in the embodiments described above the case in which the quartz crystal vibrator element 1 has a pair of vibrating arm sections 3 as the vibrating sections is explained as an example, the number of vibrating arm sections 3 can also be three or larger. Further, a beam type vibrator element composed of one vibrating arm alone having the base portion to be the fixed end can also be adopted.

Further, the quartz crystal vibrator element 1 explained in the embodiments described above can also be applied to a gyro sensor or the like besides the oscillator such as a voltage controlled crystal oscillator (VCXO), a temperature compensated crystal oscillator (TCXO), and an oven controlled crystal oscillator (OCXO).

Further, in the quartz crystal vibrator element 1, modifications, improvements, and so on within the range where at least a part of problems described above can be solved can be included in the embodiment described above.

For example, although in the explanation it is assumed that the quartz crystal vibrator element 1 is provided with the first widening section 7 and the second widening section 8, the configuration is not limited thereto, but it is also possible to assume that the first widening section 7 is not provided between the vibrating arm section 3 and the intermediate weight section 4, or the second widening section 8 is not provided between the intermediate section 4 and the tip weight section 5, which can arbitrarily be selected.

Further, although in the explanation, it is assumed that the quartz crystal vibrator element 1 is provided with the coupling section 11, the support section 12, and the cut sections 13, the configuration is not limited thereto, but the configuration without the support section 12 can also be adopted. On this occasion, the mounting electrodes are provided to either one of the coupling section 11 and the base portion 2, and the quartz crystal vibrator element 1 is fixed to the conductive fixing sections 25 with the electrically conductive adhesive 28, and is electrically connected thereto. Alternatively, the configuration without the support section 12, the coupling section 11, and the cut sections 13 can also be adopted. On this occasion, the mounting electrodes are provided to the base portion 2, and the quartz crystal vibrator element 1 is fixed to the conductive fixing sections 25 with the electrically conductive adhesive 28, and is electrically connected thereto.

Further, although the thickness dimension (in the vertical direction in the drawing) of the quartz crystal vibrator element 1 is constant in the illustration of FIGS. 3A, 3B and 4, the configuration is not limited thereto, but the base portion 2, the intermediate weight section 4, the tip weight section 5, and so on constituting the quartz crystal vibrator element 1 can be different in thickness dimension from the vibrating arm section 3. It should be noted that it is preferable that the vibrating arm sections, the intermediate weight sections, the tip weight sections, and so on constituting the quartz crystal vibrator element denoted with the same names and the same reference numerals do not have the respective thickness dimensions different from each other.

Further, although in the explanation it is assumed that the quartz crystal vibrator element 1 has two weight sections, namely the intermediate weight section 4 and the tip weight section 5, the configuration is not limited thereto, but it is also possible for the quartz crystal vibrator element 1 to have an $N^{th}$ weight section (N is an integer equal to or larger than 3) with an arm width W(N) (N is an integer equal to or larger than 3) larger than the arm width W1 of the intermediate weight section and smaller than the arm width W2 of the tip weight section disposed between the intermediate weight section 4 and the tip weight section 5. Specifically, the relationship between the arm width W(N) (N is an integer equal to or larger than 3) of the $N^{th}$ weight section, the arm width W1, and the arm width W2 can be as follows.

$$W<W1<W(N)<W(N+1)< \ldots <W(N+M)<W2$$

(M is a positive integer)

Alternatively, it is also possible to have the $N^{th}$ weight section with the arm width W(N) larger than the arm width W of the vibrating arm section 3 and smaller than the arm width W1 of the intermediate weight section 4 disposed between the vibrating arm section 3 and the intermediate weight section 4. Specifically, the relationship between the arm width W(N) (N is an integer equal to or larger than 3) of the $N^{th}$ weight section, the arm width W1, and the arm width W2 can be as follows.

$$W<W(N)<W(N+1)< \ldots <W(N+M)<W1<W2$$

Still further, it is also possible to have the $N^{th}$ weight section with the arm width W(N) larger than the arm width W2 of the tip weight section 5 on the tip side of the tip weight section 5. Specifically, the relationship between the arm width W(N) (N is an integer equal to or larger than 3) of the $N^{th}$ weight section, the arm width W1, and the arm width W2 can be as follows.

$$W<W1<W2<W(N)<W(N+1)< \ldots <W(N+M)$$

Further, the package 21 for housing the quartz crystal vibrator element 1 is not limited to the embodiment described above, but can be of a so-called cylinder type made of metal such as iron (Fe), cobalt (Co), or nickel (Ni), or an alloy containing a combination of these metals. The electrically conductive adhesive 28 can be solder.

Further, the material of the vibrator element is not limited to the quartz crystal, but can be a piezoelectric substance such as lead zirconium titanate (PZT), zinc oxide (ZnO), aluminum nitride (AlN), lithium tantalate ($LiTaO_3$), lithium tetraborate ($Li_2B_4O_7$), lithium niobate ($LiNbO_3$), or a semiconductor such as silicon as a non-piezoelectric material.

What is claimed is:

1. A vibrator element comprising:
a base;
first and second vibrating arms independently extending from the base, the first and second vibrating arms each having a first arm width;
first and second elongated grooves formed along a longitudinal direction of the first and second vibrating arms, respectively;
first and second intermediate weights each having a second arm width that is larger than the first arm width, the first and second intermediate weights independently being formed on first tip sides of the first and second vibrating arms, respectively; and
first and second tip weights each having a third arm width that is larger than the second arm width, the first and second tip weights independently being formed on second tip sides of the first and second intermediate weights, respectively, wherein
the first and second tip weights are formed immediately adjacent to the first and second intermediate weights through first and second diversions, respectively, and
three positions bisecting the first through third arm widths in each of the first and second vibrating arms are aligned in a straight line parallel in the longitudinal direction.

2. The vibrator element according to claim 1, wherein
one side of each of the first and second diversions is in a first slope shape adjusting first width differences between the second and third widths.

3. The vibrator element according to claim 2, further comprising:
third and fourth diversions disposed between the first and second vibrating arms and the first and second intermediate weights, respectively, wherein
one side of each of the third and fourth diversions is in a second slope shape adjusting second width differences between the first and second widths by gradually increasing the first width from the first and second vibrating arms toward the first and second intermediate weights, respectively.

4. The vibrator element according to claim 2, wherein
the first slope shape is provided by gradually increasing the second width from the first and second intermediate weights toward the first and second tip weights, respectively.

5. A vibrator comprising:
the vibrator element according to claim 1; and
a package adapted to house the vibrator element.

6. A vibrator comprising:
the vibrator element according to claim 2; and
a package adapted to house the vibrator element.

7. A vibrator comprising:
the vibrator element according to claim 3; and
a package adapted to house the vibrator element.

8. A vibrator comprising:
the vibrator element according to claim 4; and
a package adapted to house the vibrator element.

9. An oscillator comprising:
the vibrator element according to claim 1;
a drive circuit section electrically connected to the vibrator element; and
a package adapted to house the vibrator element and the circuit section.

10. An oscillator comprising:
the vibrator element according to claim 2;
a drive circuit section electrically connected to the vibrator element; and a package adapted to house the vibrator element and the circuit section.

11. An oscillator comprising:
the vibrator element according to claim 3;
a drive circuit section electrically connected to the vibrator element; and
a package adapted to house the vibrator element and the circuit section.

12. An oscillator comprising:
the vibrator element according to claim 4;
a drive circuit section electrically connected to the vibrator element; and
a package adapted to house the vibrator element and the circuit section.

13. An electronic apparatus comprising:
the vibrator element according to claim 1; and
a circuit section electrically connected to the vibrator element.

14. An electronic apparatus comprising:
the vibrator element according to claim 2; and
a circuit section electrically connected to the vibrator element.

15. An electronic apparatus comprising:
the vibrator element according to claim 3; and
a circuit section electrically connected to the vibrator element.

16. An electronic apparatus comprising:
the vibrator element according to claim 4; and
a circuit section electrically connected to the vibrator element.

17. An electronic apparatus comprising:
the vibrator element according to claim 1;
wherein the first arm width is substantially constant;
the second arm width is substantially constant; and
the third arm width is substantially constant.

* * * * *